United States Patent [19]

Krueger

[11] 4,231,008
[45] Oct. 28, 1980

[54] COIL FOR THE PRODUCTION OF HOMOGENEOUS MAGNETIC FIELDS

[75] Inventor: Gottfried J. Krueger, Reno di Leggiuno, Italy

[73] Assignee: European Atomic Energy Community, Luxembourg

[21] Appl. No.: 964,640

[22] Filed: Nov. 29, 1978

[30] Foreign Application Priority Data

Dec. 12, 1977 [DE] Fed. Rep. of Germany ....... 2755357

[51] Int. Cl.$^3$ ........................... H01F 7/06; H01F 7/22
[52] U.S. Cl. .................................... 335/209; 335/216; 324/320
[58] Field of Search ....................... 335/209, 216, 213; 324/0.5 H, 0.5 MA

[56] References Cited

U.S. PATENT DOCUMENTS

| | | | |
|---|---|---|---|
| 3,199,021 | 8/1965 | Anderson | 335/209 |
| 3,258,657 | 6/1966 | Peuron et al. | 335/216 |
| 3,409,852 | 11/1968 | Uhlmann et al. | 335/216 |
| 4,095,202 | 6/1978 | Danielsson et al. | 335/213 |

FOREIGN PATENT DOCUMENTS

| | | |
|---|---|---|
| 2045978 | 3/1971 | Fed. Rep. of Germany . |
| 2050333 | 4/1972 | Fed. Rep. of Germany . |
| 1179740 | 1/1970 | United Kingdom . |
| 1309089 | 3/1973 | United Kingdom . |
| 1327551 | 8/1973 | United Kingdom . |
| 1390902 | 4/1975 | United Kingdom . |

OTHER PUBLICATIONS

Generation of Uniform Magnetic Fields by Means of Air-Coils-Franzen—Review of Scientific Instruments, vol. 33, 1962, No. 9, pp. 933-938.

Coil Arrangements for Producing a Uniform Magnetic Field-Harris—Journal of Research of the National Bureau of Standards, vol. 13, 1934, pp. 391-401.

Nuclear Instruments and Methods, 78 (1970), pp. 181-184.

*Primary Examiner*—Harold Broome
*Attorney, Agent, or Firm*—Stevens, Davis, Miller & Mosher

[57] ABSTRACT

A coil for the production of homogeneous magnetic fields; the coil sides are disposed in sets of four arranged symmetrically about a common axis to which the coil sides are parallel. There are 2n turns of the coil and the disposition of coil sides is such that the n sums, each of which is the sum of 2n turns respectively of the quantities $\cos 3\psi\mu/R^3\mu$, $\cos 5\psi\mu/R^5\mu$ etc to $\cos (2n+1)\psi\mu/R^{2n+1}\mu$ are all substantially zero on the supposition that equal currents flow through all the turns of the coil. The equality to zero need not be exact, variation of up to 10° in the angles for invariant R or variation of up to 10% in the various $R\mu$ for invariant angles $\psi\mu$ being tolerable. The coil ($1 \leq \mu \leq n$) is particularly intended for use in the measurement of the properties of liquid media by determinations of nuclear resonance.

6 Claims, 23 Drawing Figures

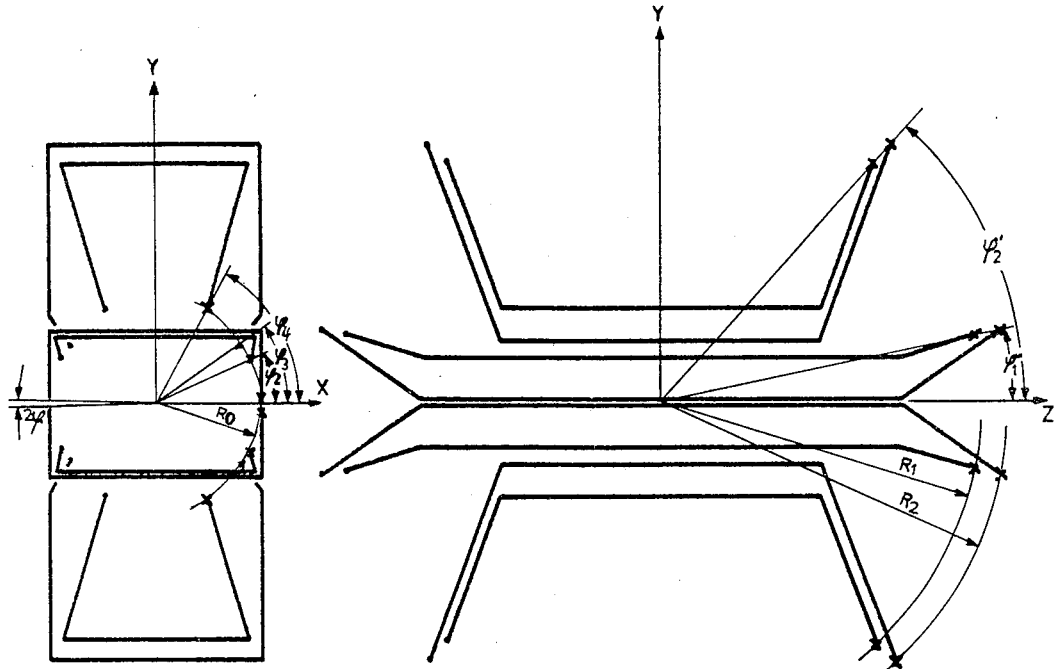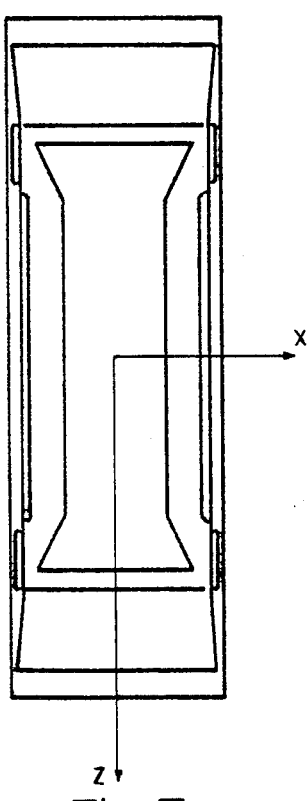
Fig. 7a
Fig. 7b
Fig. 7c

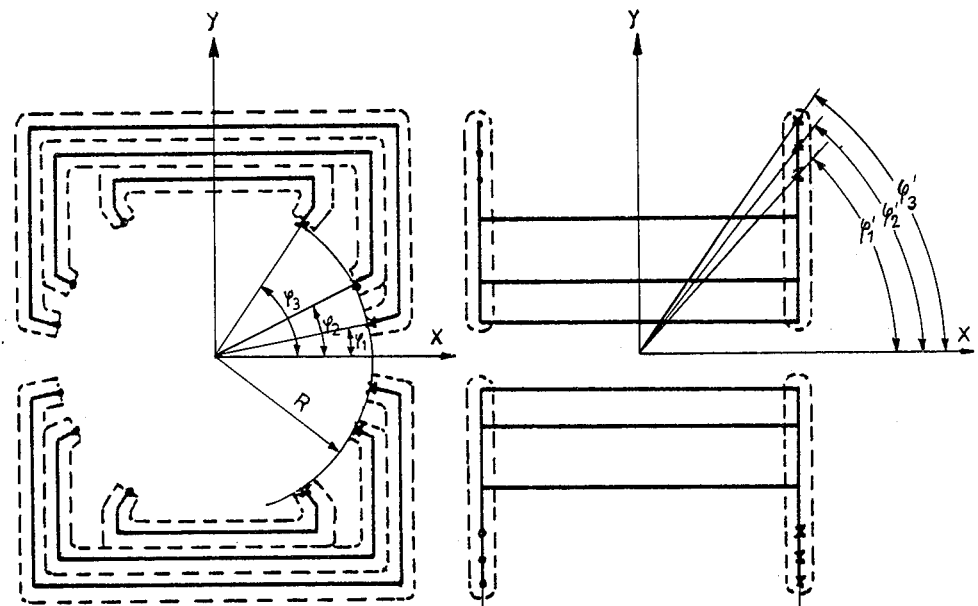
Fig. 9a
Fig. 9b
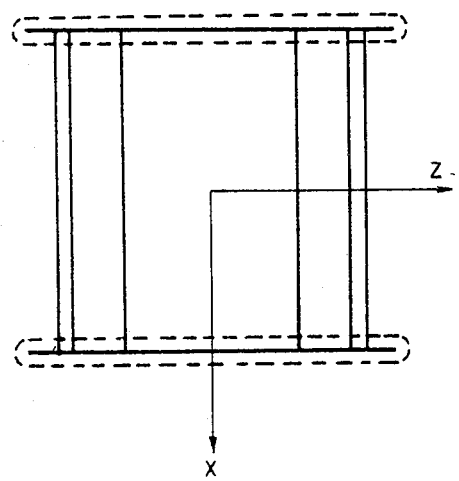
Fig. 9c

COIL FOR THE PRODUCTION OF HOMOGENEOUS MAGNETIC FIELDS

BACKGROUND OF THE INVENTION

The invention relates to a coil for producing magnetic fields having high or very high homogeneity.

In order to measure the properties of liquid media by nuclear magnetic resonance, use is made of a very homogeneous static magnetic field $H_o$, which is generated either by an iron magnet, a permanent magnet, by air coils or by superconductive coils, in conjunction with a magnetic high-frequency field $2H_1 \cos \omega_o t$, where $\omega_o$ is the resonance frequency in the field $H_o$ of the nuclear spin under investigation (A. Abragam, "The Principles of Nuclear Magnetism", Clarendon Press, Oxford, 1961 and A. Lösche "Kerninduktion", VEB Deutscher Verlag der Wissenschaften, Berlin, 1957). If $H_o$ is not sufficiently homogeneous, the effect of inhomogeneity can be partly compensated by using "nucler spin echoes" and the measurements can be performed as if the $H_o$ field was considerably more homogeneous (see the aforementioned citations). To this end, use is made of a sequence of high-frequency pulses, the lengths and intervals between which are adjusted in accordance with the particular measurement. This experiment is more successful in proportion to the homogeneity of the high-frequency amplitude $H_1$ used. The problem therefore arises of making $H_o$ and $H_1$ as homogeneous as possible throughout the volume of substance under investigation.

If, more particularly, the substance under investigation has a large volume of measurement (e.g. in the case of mass flow measurements by nuclear magnetic resonance), $H_1$ is non-uniform in a normal cylindrical coil, which must be relatively short in the first case (coil length≈diameter). This also applies to the coil proposed by R. H. Lyddane and A. E. Ruark, Rev. Sci. Instr. 10, 253, 1939), hereinafter called the LR coil. In most cases, the homogeneity is worse in proportion to the ratio of the diameter of the substance under investigation to the diameter of the coil. The same effect occurs in the case of $H_o$, if this static magnetic field is generated by an air coil or a superconductive coil. A further difficulty in the case of the high-frequency ($H_1$) transmitting coil is that if the volume is large, the high-frequency power has to be considerable, and this results in a considerable high-frequency voltage. This means that the turns in the coil must be well insulated from one another. The LR coil, which initially has only two turns, is fairly homogeneous, but has a small $H_1$ field at its center. If the coil comprises two stacks of turns and the turns are close together, $H_1$ becomes larger but the insulation problem becomes almost insoluble, since oscillating voltages of the order of 10,000 V occur.

It is known to solve the aforementioned problem by using a cylindrical coil, which is relatively inhomogeneous and has a considerable leakage field at its ends, i.e. the field is not sharply defined at the ends. The interior of the coil is accessible only from its ends. Insulation becomes difficult if the high-frequency voltages are considerable. The field extends axially inside the coil. However, transverse magnetic fields $H_o$ and $H_1$ are required for measuring mass flow at a loop or discharge duct, using nuclear resonance. The cylindrical coil has the previously-mentioned disadvantages even when the field inside the coil is made more homogeneous by specially arranging the turns. Consequently, a cylindrical coil is not suitable for measuring mass throughput by nuclear resonance, either as a field coil or as a high-frequency transmitter coil, but can be used as a high-frequency receiving coil. Admittedly the LR coil has a transverse field and its interior is accessible from all directions, but is not sufficiently homogeneous as a high-frequency transmitter coil and field coil when the volumes are large. When the high-frequency field strength is considerable, an LR coil needs to have a number of closely adjacent turns, which are difficult to insulate from one another, as previously described.

An object of the invention is to provide a coil of the aforementioned kind which can be used to generate very homogeneous magnetic fields and, more particularly, provides a homogeneous magnetic field over a large volume of sample under observation.

SUMMARY OF THE INVENTION

The present invention provides a coil having an even plurality, greater than 2 turns, of which the coil sides, constituted by wires or stacks, are in groups of four all of which are parallel to a common axis which in the specification that follows is presumed to be a Z-axis. The coil sides are disposed symmetrically about that axis and are positioned such that certain equations, set out in more detail in the text of this specification, are substantially satisfied. For $2n$ turns, there are $n$ such equations, each of which prescribes a value of zero for the respective sum of the following terms of the quantity $\cos (2r+1)\phi_\mu/R^{2r+1}$. The sums are taken for $1 \leq \mu \leq n$, on the presumption of equal currents through every coil side, wherein $r$ is a positive integer and for the respective equations has the values $1 \leq r \leq n$. In these equations, $R\mu$ is the distance of the $\mu$th coil sides from the central axis of the coil and $\phi_\mu$ is the angle between the x axis and the line joining the central axis to the coil side in the first quadrant.

Coils according to the invention may have greater homogeneity and surround the permitted volume more closely than, for example, a Helmholtz coil. The coils may be made up of single wires or of stacks of turns according to preference. If the coils are composed of single wires, the individual turns can be well insulated from one another. Such coils are suitable as high frequency coils transmitting high power in order to produce homogeneous magnetic high frequency fields. The coils according to the invention may give higher magnetic field strength and greater homogeneity than the known LR coil for a given current.

BRIEF SUMMARY OF THE DRAWINGS

FIG. 3 shows a very homogeneous coil according to the invention comprising three elements, shown in three views of the spatial planes;

FIG. 5 shows another embodiment of a very homogeneous coil according to the invention comprising four elements, parts of the coils being omitted, showing three views of the spatial planes;

FIG. 6 shows a very homogeneous coil comprising four elements according to FIGS. 5a–c, elongated in the z direction, showing two views of the spatial planes;

FIG. 7 shows another embodiment of the very homogeneous coil according to FIGS. 5a–c, having oblique projections at the ends of the coil, showing three views of the spatial planes;

FIG. 7a is the vertical section,

FIG. 7b the side view, and

FIG. 7c the ground plan of the coil;

FIG. 8 shows another embodiment of the very homogeneous coil according to the invention comprising three elements all of equal length in the z direction, showing three views of the spatial planes;

FIG. 9 is another embodiment of the very homogeneous high-frequency coil according to the invention made up of three elements, parts being omitted as before, showing three views of the spatial planes;

FIG. 9a is the vertical section,

FIG. 9b the side view, and

FIG. 9c the ground plan of the coil;

DESCRIPTION OF THE PREFERRED EMBODIMENTS

Figure 1:
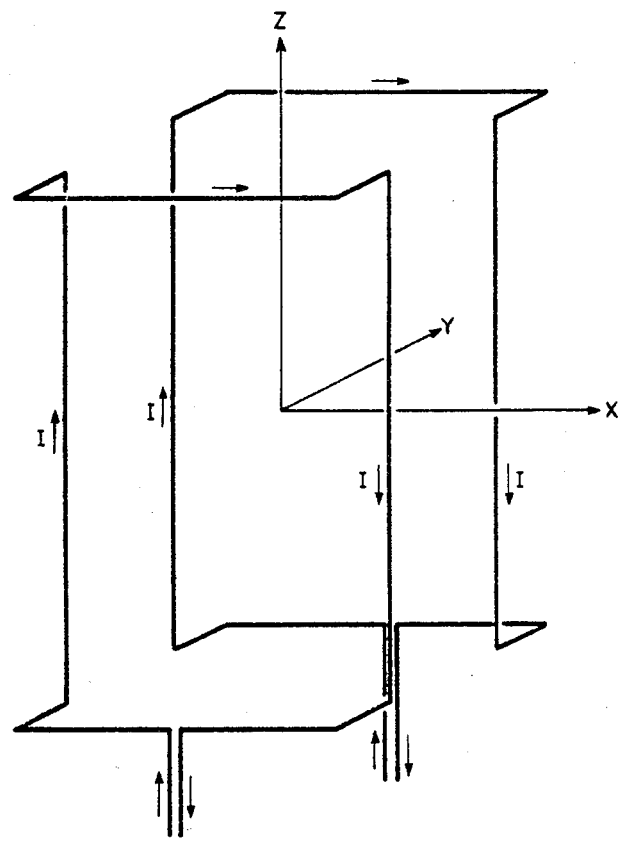
FIG. 1 is a diagrammatic perspective view of the element of a coil according to the invention.
Figure 2:
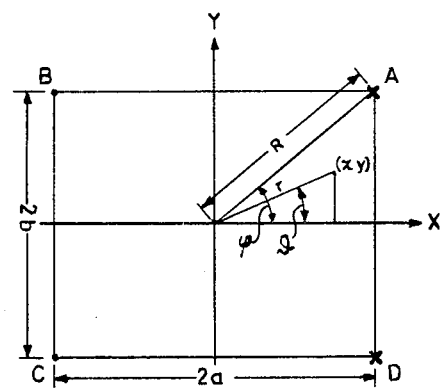
FIG. 2 is a cross-section of a coil element of FIG. 1 in the x, y plane.

FIG. 1 is a diagrammatic perspective view of an element of a coil according to the invention, the direction of the current I being indicated by arrows. FIG. 2 shows a cross-section of the coil element in FIG. 1 in the x, y plane, R being the distance between the four wires (or winding stacks if required), through all of which the same current I flows, the distance being given in the direction from the central axis of the coil. $\phi$ is the angle between the x axis and the line joining the central axis to the wire (or winding stack) in the first quadrant. In other respects, the coil element is completely symmetrical relative to the coordinate axes. The magnetic field $H_y$ of a coil comprising n such elements with $R_\mu$ being the modius and $\phi_\mu$ being the angle of the $\mu$th element) and infinitely long in the z direction is most homogeneous if the following n equations are satisfied:

$$\sum_{\mu=1}^{n} \frac{\cos 3\phi_\mu}{R_\mu^3} = 0 \quad (1)$$

$$\sum_{\mu=1}^{n} \frac{\cos 5\phi_\mu}{R_\mu^5} = 0 \quad (2)$$

$$\vdots$$

$$\sum_{\mu=1}^{n} \frac{\cos(2n+1)\phi_\mu}{R_\mu^{2n+1}} = 0 \quad (n)$$

If these equations are satisfied, $H_x$ is also smallest near the center.

For n=1, only equation (1) can be satisfied with $\phi_1=30°$. This is the case of the LR coil. If n=2, equations (1) and (2) can be satisfied; equation (3) can also be satisfied if n=3, and so on. The homogeneity of $H_y$ progressively improves and $H_x$ simultaneously decreases, in proportion to n (see the following explanations). The n equations (1) to (n) determine the n angles or the n radii. In the following Table 1, angles for n=2, 3 and 4 are given by way of example for various coils having elements of equal radii, n being the number of wires per quadrant.

TABLE 1

Coils having turns (or coil stacks) all of which are flowed through by the same current and all of which have the same radius:

| No. | n (number of wires per quadrant) | $\phi_1$ | $\phi_2$ | $\phi_3$ | $\phi_4$ |
|---|---|---|---|---|---|
| 1 | 2 | 12,0000 | 48,0000 | — | — |
| 2 | 2 | 24,0000 | 84,0000 | — | — |
| 3 | 3 | 11,6704 | 26,9366 | 56,0562 | — |
| 4 | 4 | 0,57143 | 24,8571 | 35,1429 | 60,8571 |
| 5 | 4 | 9,42857 | 26,5714 | 50,5714 | 86,5714 |

Table 2 hereinafter gives the radius ratio $R_2/R_1$ and the angles $\phi_1$ and $\phi_2$ for coils with n=2 and having elements with different radii $R_1$ and $R_2$:

Table 2

Coils having turns (or coil stacks) through all of which the same current flows, but which have different radii.

In such cases, it is very difficult to solve equations (1) to (n) even if n is relatively small.

If n=2, we have:

(a) $R_2/R_1 < 1$.

In such cases, the only real solutions of (1) and (2) are for $R_2/R_1 \geq 0.782\ 815\ 3012$.

At other values of $R_2/R_1$, the values of $\phi$ are as follows:

| $R_2/R_1$ | $\phi_1$ | $\phi_2$ | Notes |
|---|---|---|---|
| 0,95 | 8,38253 | 46,9686 | In this case there are three values for possible pairs of values for $\phi_1$ and $\phi_2$. |
| | 49,3487 | | |
| | 82,5033 | 23,6182 | |
| 0,9 | 51,2535 | 16,3884 | In these cases there are only two possible pairs of values for $\phi_2$ and $\phi_2$. |
| | 80,4528 | 23,1825 | |
| 0,8 | 59,4925 | 19,7383 | |
| | 71,9462 | 21,8256 | |
| 0,79 | 61,6354 | 20,1928 | |
| | 69,7791 | 21,5149 | |
| 0,785 | 63,4433 | 20,5274 | |
| | 67,9594 | 21,2491 | |
| 0,783 | 65,0409 | 20,7972 | |
| | 66,3570 | 21,0062 | |
| 0,7828153012 | 65,6987 | 20,9030 | In this limiting case there is only one possible pair of values for $\phi_1$ and $\phi_2$. |

(b) $R_2/R_1 > 1$.

In this case there are real solutions of (1) and (2) for any given values of $R_2/R_1$. However, at large values of $R_2/R_1$, one of the angle $\phi$ is always nearly 90°, with the result that these coils are useless in practice. The detailed results are as follows:

| $R_2/R_1$ | $\phi_1$ | $\phi_2$ | Notes |
|---|---|---|---|
| 1,05 | 14,3391 | 49,2739 | In this case there are three possible pairs of values for $\phi_1$ and $\phi_2$. |
|  | 47,0129 | 8,60810 |  |
|  | 85,1337 | 24,3451 |  |
| 1,1 | 16,0607 | 50,8522 | In this case there are only two possible pairs of values for $\phi_1$ and $\phi_2$. |
|  | 86,0126 | 24,6620 |  |
| 1,25435 | 19,8521 | 59,9960 | In this limiting case there are just two possible pairs of values for $\phi_1$ and $\phi_2$. |
|  | 87,7377 | 25,5043 |  |
| 1,4 | 88,6056 | 26,1512 | In these cases there is only one possible pair of values for $\phi_1$ and $\phi_2$. When $R_2/R_1$ increases, $\phi_1$ approaches 90° and $\phi_2$ approaches 30°. |
| 10 | 89,9999 | 29,9013 |  |

Finally, Table 3 shows some characteristic results of a computer calculation giving the relative field deviation $(H_y - H_{yo})/H_{yo}$ ($H_{yo}$ is the field at the center) for some coils from Table 1 with n=2, 3 and 4, in comparison with the deviation in the field of the LR coil (n=1). It is very clear that the LR coil is greatly inferior to the coils in Table 1, both with respect to the field strength at the center and with respect to the homogeneity at a given distance from the center.

TABLE 3

Numerical values of the relative deviation in the field inside coils 1, 3 and 4 of Table 1. In the calculation, the coils were assumed to be infinitely long, and the theoretical optimum values in Table 1 were used for the angle $\phi_\mu$ of the current paths.

The table gives the deviation from the field by comparison with the LR coil. First, the field $H_{yo}$ at the center of the coils is given in arbitrary units (denoted by $H_o$) in accordance with (A.7). In order to obtain the field in useful units, these values must be multiplied by $I/2\pi$ (I=current per turn) and divided by the coil radius R.

The angles $\phi_\mu$ of the coil wires are given, followed by the relative deviations from the field $(H_y - H_{yo})/H_{yo}$ in dependence on the coordinates $\rho = r/R$ and $\theta$. At low values of $\rho$, the series (A.4b) was used, whereas the accurate formula (A.2b) was used for high values of $\rho (\geq 0.5)$. The small deviations for $\rho = 0.5$ in the parts A and B of the Table, more particularly for the four-wire coil, are due to the inaccuracy of the computer in applying (A.2b). The best values were obtained from the series.

TABLE 3

| | (A) Calculated using series (A.4b) | | | | (B) Calculated using formula (A.2b) | | | |
|---|---|---|---|---|---|---|---|---|
| | Number of wires per quadrant | | | | Number of wires per quadrant | | | |
| | 1 | 2 | 3 | 4 | 1 | 2 | 3 | 4 |
| $H_o$ | 3,4641 | 6,58911 | 9,71686 | 12,8478 | 3,4641 | 6,58911 | 9,71686 | 12,8478 |
| Angle | 30 | 12 | 11,6701 | 0,857143 | 30 | 12 | 11,6704 | 0,857143 |
|  |  | 48 | 26,9366 | 24,8571 |  | 48 | 26,9366 | 24,8571 |
|  |  |  | 56,0562 | 35,1429 |  |  | 56,0562 | 35,1429 |
|  |  |  |  | 60,8571 |  |  |  | 60,8571 |

| | | LR coil | Coils in Table 1 | | | LR coil | Coils in Table 1 | | |
| | | | 1 | 3 | 4 | | 1 | 3 | 4 |
|---|---|---|---|---|---|---|---|---|---|
| | 0 | −1,0100E-04 | 6,17933E-07 | −6,34109E-09 | 8,08118E-11 | | | | |
| $\delta = 0,1$ $\gamma = 45$ | | 1,00000E-04 | 6,19962E-13 | −6,32515E-09 | −6,17985E-13 | | | | |
| | 90 | −9,90001E-05 | −6,17934E-07 | −6,30740E-09 | −7,95756E-11 | | | | |
| | 0 | −1,66389E-03 | 3,94492E-05 | −1,63458E-06 | 8,46532E-08 | | | | |
| $\delta = 0,2$ $\gamma = 45$ | | 1,60000E-03 | 2,52793E-09 | −1,62097E-06 | −2,52822E-09 | | | | |
| | 90 | −1,53610E-03 | −3,94543E-05 | −1,59999E-06 | −7,95837E-08 | | | | |
| | 0 | −8,822573-03 | 4,44310E-04 | −4,22704E-05 | 5,06611E-06 | | | | |
| $\delta = 0,3$ $\gamma = 45$ | | 8,09946E-03 | 3,25801E-07 | −4,17385E-05 | −3,26315E-07 | | | | |
| | 90 | −7,37638E-03 | −4,44972E-04 | −4,02501E-05 | −4,40495E-06 | | | | |
| | 0 | −0,0295749 | 2,41591E-03 | −4,25803E-04 | 9,47021E-05 | | | | |
| $\delta = 0,4$ $\gamma = 45$ | | 0,0255828 | 1,01036E-05 | −4,22337E-04 | −1,01560E-05 | | | | |
| | 90 | −0,0215925 | −2,43718E-03 | −3,88698E-04 | −7,35385E-05 | | | | |
| | 0 | −0,0769231 | 8,51624E-03 | −2,55731E-03 | 9,43360E-04 | −0,0769231 | 8,51607E-03 | −2,55722E-03 | 9,43303E-04 |
| $\delta = 0,5$ $\gamma = 45$ | | 0,0622407 | 1,41454E-04 | −2,59045E-03 | −1,43329E-04 | 0,0622406 | 1,41501E-04 | −2,59048E-03 | −1,43409E-04 |
| | 90 | −0,0476191 | −8,83687E-03 | −2,18640E-03 | −6,26452E-04 | −0,047619 | −8,83687E-03 | −2,18642E-03 | −6,25385E-04 |
| | 0 | | | | | −0,168399 | 0,021176 | −0,0111631 | 6,38378E-03 |
| | 30 | | | | | 0,116911 | −0,0330115 | 5,79226E-03 | 3,65603E-03 |
| $\delta - 0,6$ $\gamma = 45$ | | | | | | 0,127147 | −0,0117735 | −1,29616E-03 | |
| | 60 | | | | | 0,0173352 | 0,0304945 | 7,01487E-03 | −1,10585E-03 |
| | 90 | | | | | −0,0870032 | −0,0242143 | −8,55255E-03 | −3,41219E-03 |
| | 0 | | | | | −0,320091 | 0,0325376 | −0,0403588 | 0,0337505 |
| | 30 | | | | | 0,269393 | −0,0926566 | 0,022895 | 0,0183438 |
| $\delta = 0,7$ $\gamma = 45$ | | | | | | 0,22317 | 6,45208E-03 | −0,0443853 | −6,95199E-03 |
| | 60 | | | | | 2,14827E-03 | 0,0775596 | 0,0290899 | −2,93040E-03 |
| | 90 | | | | | −0,138778 | −0,0536604 | −0,0253665 | −0,0132561 |
| | 0 | | | | | −0,532225 | −0,0155288 | −0,135225 | 0,155616 |
| | 35 | | | | | 0,708266 | −0,247584 | −5,46157E-03 | 0,0949845 |
| $\delta = 0,8$ $\gamma = 45$ | | | | | | 0,318962 | 0,0227773 | −0,146395 | −0,030238 |
| | 55 | | | | | 0,0359565 | 0,236565 | 0,0198623 | −0,0790128 |
| | 90 | | | | | −0,199844 | −0,100232 | −0,0598057 | −0,0388062 |
| | 0 | | | | | −0,775441 | −0,31726 | −0,427135 | 0,749445 |
| | 35 | | | | | 1,55039 | −0,56317 | −0,0298044 | 0,338185 |
| $\delta = 0,9$ $\gamma = 45$ | | | | | | 0,291377 | −0,0316952 | −0,404494 | −0,116678 |
| | 55 | | | | | −0,0548428 | 0,547715 | 0,109403 | −0,314218 |
| | 90 | | | | | −0,266048 | −0,162768 | −0,115847 | −0,0885185 |

Figure 3A:
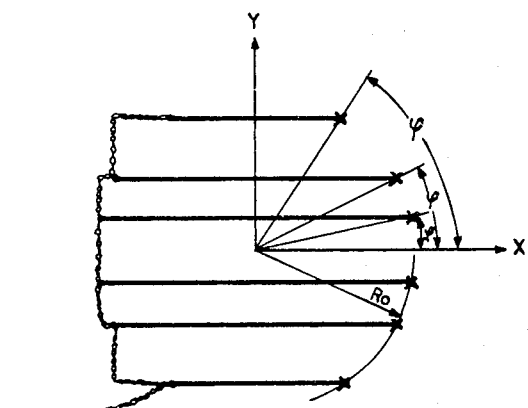
FIG. 3a is the vertical section.
Figure 3B:
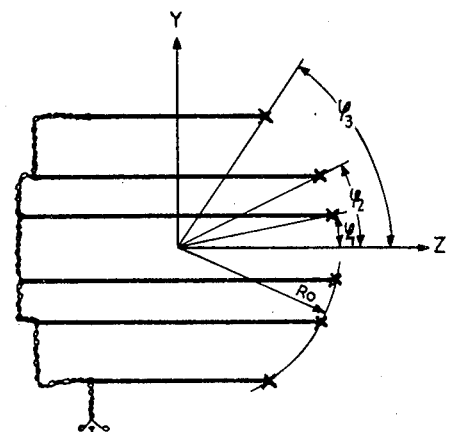
FIG. 3b the side view.
Figure 3C:
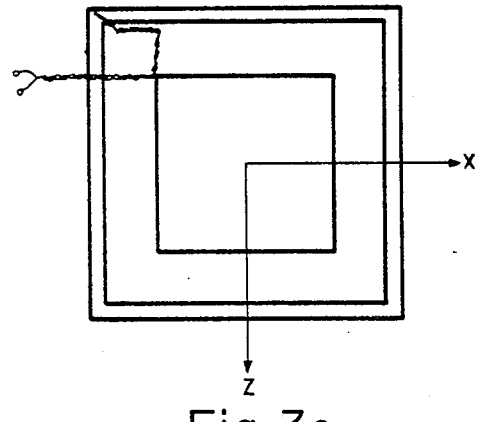
FIG. 3c the ground plan of the coil.
Figure 4A:
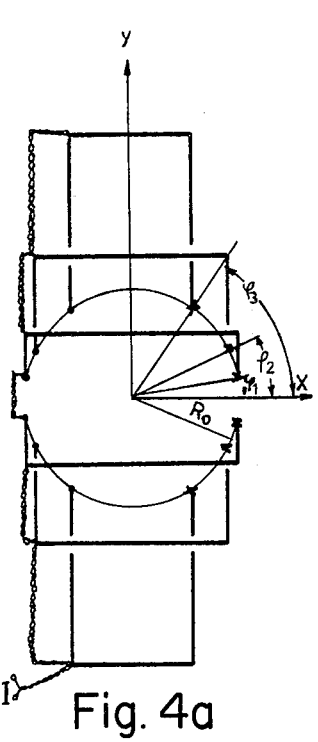
FIG. 4a is the vertical section, FIG. 4b the side view, and FIG. 4c the ground plan of the coil.
Figure 4B:
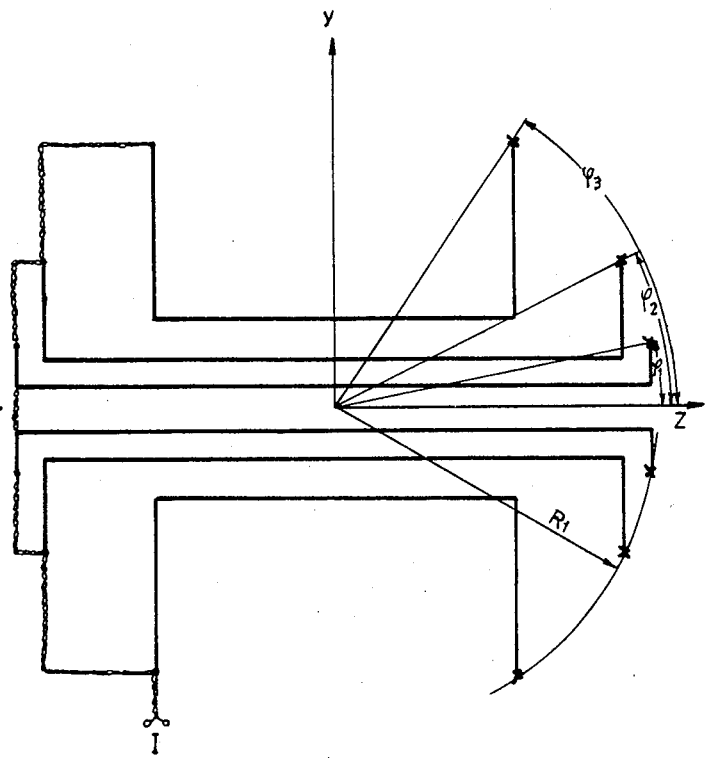
FIG. 4 shows a very homogeneous coil according to the invention, elongated in the z direction and comprising three elements, in three views of the spatial planes.
Figure 4C:
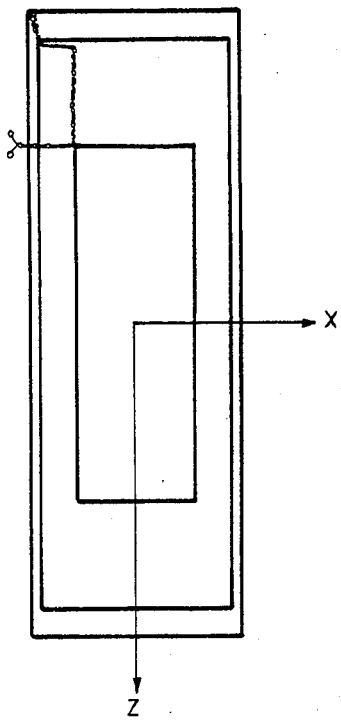

In the case of coils which are very long in the z direction in comparison with all the radii $R_\mu$, the preceding definitions are adequate. In the case of shorter coils, allowance must be made for the effect of cross-connections between the elements in FIG. 1. The following three cases must be distinguished:

(1) Coils which, relative to all the coordinate axes, need to be homogeneous near the middle only, for small values of x, y and z. In this case, a simple solution is to use the same angles in the y, z plane as in the x, y plane. An example of coil 3 in Table 1 is shown in FIG. 3, which also shows the bifilar connections between the windings and for supplying the current I. A coil of this kind is equally homogeneous in all coordinate directions. The coil can also be prolonged in the z direction while still using the same angles in the y, z plane as in the x, y plane (see FIG. 4). The currents in the y direction at the projections at the ends of the windings in the coil elements do not contribute to the magnetic field near the center. Hence we obtain the embodiments of coil 4 in Table 1, shown in FIGS. 5-7. This coil has the four angles of Table 1 in the x, y plane. In the y, z plane, on the other hand, pairs of turns have the angles 12° and 48° of a coil with n=2. The coil, however, is still sufficiently long to be very homogeneous near the middle (see hereinafter).

Figure 8A:
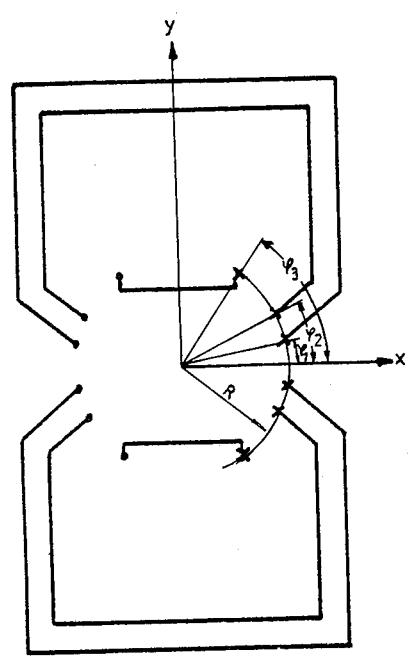
FIG. 8a is the vertical section.
Figure 8B:
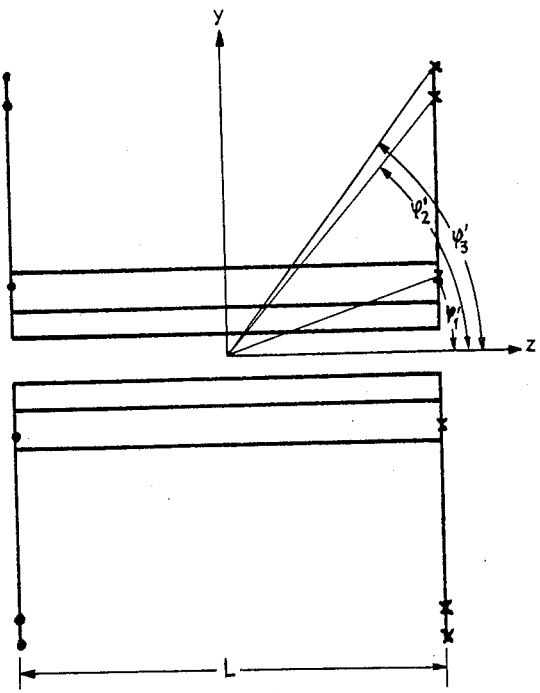
FIG. 8b the side view.
Figure 8C:
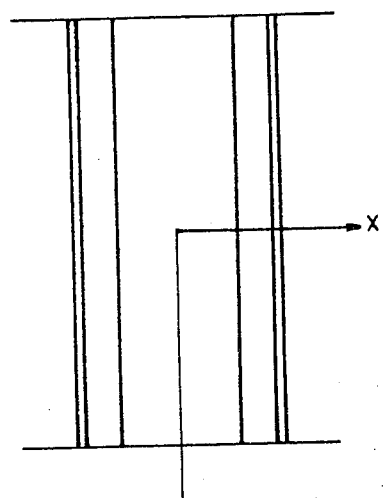
FIG. 8c the ground plan of the coil.

(2) Coils which are very homogeneous in the x, y plane and remain substantially homogeneous up to their end in the z direction, after which they decrease very rapidly to a zero field, i.e. the field is sharply bounded in the z direction. Only approximations to coils of this kind can be constructed. FIG. 8 gives an example for n=3. As before, the angles in the x, y plane are from Table 1. The angles in the y, z plane are determined by (1), taking care to make (2) as small as possible. Further details and explanations will be given hereinafter. A coil of this kind is homogeneous in proportion to its length. If necessary, screens or deflectors can be placed at the end in order to concentrate the leakage field from the inter-connections and cause it to disappear rapidly outside the coil.

(3) If the aforementioned coils are used as high-frequency coils, the inter-connections can usually be screened, in which case the angles in the y, z plane are of subordinate importance. However, care should be taken that the screens have sufficiently low capacitance and that the entire coil is sufficiently symmetrical to ensure that its good properties are not offset by interfering reactive currents, resulting in non-uniformity in the longitudinal currents generating the field. An embodiment of a coil of this kind is shown in FIG. 9, in which the screening is also indicated by broken lines. As before, the connections and leads are omitted.

If high-frequency fields are generated by coils of the aforementioned kind having only one wire per element, as shown in FIGS. 3-9, there are large distances between individual turns (each coil element in FIG. 1 has two turns), so that the turns can be effectively insulated from one another when the oscillating voltages are high. The coils can therefore be used when the HF output is high, e.g. in the HF transmitter coil during measurements of mass flow in a reactor loop, using nuclear magnetic resonance. Owing to the geometry of this particular problem, coils of the first kind (FIGS. 3-7) are unsuitable for this purpose. Coils of the second kind (FIG. 8) and of the third kind (FIG. 9) are both suitable for this problem. However, the coil in FIG. 9 makes better use of its volume, owing to the greater angle $\phi_1'$ in the y, z plane, since in this case the diameter of a loop tube disposed in the coil can be greater, relative to the coil diameter, than in the coil in FIG. 6.

Figure 10:
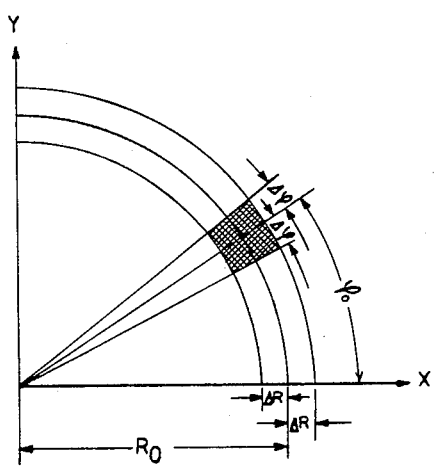
FIG. 10 is a cross-section of a winding stack in the x, y plane.

In all these coils the individual wires shown in the drawings can be replaced by winding stacks without reducing homogeneity, provided that the stacks have the segmental shape shown in FIG. 10, in which case all the n parallel bundles of one coil have the same $\Delta\phi$ and $\Delta R$ if the parallel bundles have the same radius. This point will also be fully illustrated and explained hereinafter.

This modification is particularly useful for generating magnetic d.c. fields homogeneous over large volumes, since the number of turns, i.e. the number of Ampere turns (i.e. the field strength) can be considerably increased. As before, the coils can either be air coils or superconductive coils for high fields.

The following details relate to the construction of the various coils:

A. Very long coils

At a point x, y in the coil element of FIG. 2, which is assumed to be infinitely long in the z direction, the components of the magnetic field strength are as follows, if the same current I flows through all four wires:

$$H_x = \frac{I}{2\pi} h_x, \quad H_y = \frac{I}{2\pi} h_y \text{ and } H_z = 0 \tag{A.1}$$

The geometrical components are given by:

$$h_x = -\frac{b+y}{(a+x)^2+(b+y)^2} + \frac{b+y}{(a-x)^2+(b+y)^2} - \frac{b-y}{(a-x)^2+(b-y)^2} + \frac{b-y}{(a+x)^2+(b-y)^2} \tag{A.2a}$$

$$h_y = \frac{a+x}{(a+x)^2+(b+y)^2} + \frac{a-x}{(a-x)^2+(b+y)^2} + \frac{a-x}{(a-x)^2+(b-y)^2} + \frac{a+x}{(a+x)^2+(b-y)^2} \tag{A.2b}$$

where $a = R \cos\phi$ and $b = R \sin\phi$; or in cylindrical coordinates (r, $\theta$, z):

$$h_x = -\frac{4}{R}\rho^2\cos\phi\sin 2\theta \; \frac{1-2\cos 2\phi+\rho^2\cos 2\theta-\rho^4}{1-4\rho^2\cos 2\phi\cos 2\theta+2\rho^4(1+\cos 4\phi+\cos 4\theta)-4\rho^6\cos 2\phi\cos 2\theta+\rho^8} \tag{A.3a}$$

$$h_y = \frac{4}{R}\cos\phi \; \frac{1-\rho^2(1+2\cos 2\phi)\cos 2\theta+\rho^4(2\cos 2\phi+\cos 4\theta)-\rho^6\cos 2\theta}{1-4\rho^2\cos 2\phi\cos 2\theta+2\rho^4(1+\cos 4\phi+\cos 4\theta)-4\rho^6\cos 2\phi\cos 2\theta+\rho^8} \tag{A.3b}$$

with $\rho = r/R$.

The series expansion of these two expressions, relative to the coordinate origin, is:

$$h_x = \frac{4}{R} \sum_{\nu=0}^{\infty} \cos[(2\nu+1)\phi] \sin(2\nu\theta) \rho^{2\nu} \tag{A.4a}$$

$$h_y = \frac{4}{R} \sum_{\nu=0}^{\infty} \cos[(2\nu+1)\phi] \cos(2\nu\theta) \rho^{2\nu} \tag{A.4b}$$

These expressions apply to a single coil element. The following expression is obtained by summation over n such elements, if the same current flows through all of them:

$$C_{\mu,\nu} = \frac{1}{4\Delta R_\mu \Delta \phi_\mu R_{\mu o}} \quad (A.5a)$$

$$h_x = 4 \sum_{\nu=0}^{\infty} \left( \sum_{\mu=1}^{n} \frac{\cos[(2\nu + 1)\phi_\mu]}{R_\mu^{2\nu+1}} \right) \sin(2\nu\theta)\, r^{2\nu}$$

$$h_x = 4 \sum_{\nu=0}^{\infty} \left( \sum_{\mu=1}^{n} \frac{\cos[(2\nu + 1)\phi_\mu]}{R_\mu^{2\nu+1}} \right) \cos(2\nu\theta)\, r^{2\nu} \quad (A.5b)$$

These series expansions are valid only if r is less than all the $R_\mu$ terms. In order to ensure that $h_y$ retains its value at the origin also for the maximum value of r, i.e. is as homogeneous as possible, the terms containing low powers of r must vanish. The $2\nu$ order term must therefore be:

$$\sum_{\mu=1}^{n} \frac{\cos[(2\nu + 1)\phi_\mu]}{R_\mu^{2\nu+1}} = 0 \quad (A.6)$$

If there are n elements in the coil, this results in the n defining equations (1) ... (n) given hereinbefore for the construction of homogeneous coils. The zero-order term remains in $h_y$ and determines the field strength $H_{yo}$ at the middle of the coil:

$$h_{yo} = 4 \sum_{\mu=1}^{n} \frac{\cos \phi_\mu}{R_\mu} \quad (A.7)$$

The zero-order term in $h_x$ vanishes. $H_x$ is always zero at the center (this follows from the symmetry). Since the coefficients of the terms of equal order are the same in both series (A.5a) and (A.5b) it also follows that, as n increases, $h_x$ vanishes progressively more completely over progressively larger regions, whereas $h_y$ becomes progressively more homogeneous over the same larger regions. The field strength at the middle of the coil:

$$H_x = 0$$

$$H_y = \frac{I}{2\pi} 4 \sum_{\mu=1}^{n} \frac{\cos \phi_\mu}{R_\mu} \quad (A.8)$$

is obtained in A/m if I is measured in A and the $R_\mu$ terms are measured in m.

If the currents in the individual windings are different, the n defining equations can easily be modified by multiplying each $\mu^{th}$ expression by the corresponding current $I_\mu$. If there are bundles of wires (winding stacks) instead of individual wires at the points $R_\mu$, $\phi_\mu$, equations (A.1) to (A.8) must be integrated over the bundle cross-section. The resulting expressions are in the form:

$$C_{\mu,\nu} = \frac{\iint \frac{\cos[(2\nu + 1)\phi_\mu]}{R_\mu^{2\nu}} d\phi_\mu dR_\mu}{\iint R_\mu d\phi_\mu dR_\mu} \quad (A.9)$$

These expressions must be integrated over the bundle cross-section. If the bundles have the cross-section shown in FIG. 8, the integrals can easily be integrated, thus obtaining the following expression for the coefficients of the $2\nu^{th}$ order terms for the $\mu^{th}$ winding stack:

$$C_{\mu,\nu} = \int_{\phi_{\mu o}-\Delta\phi_\mu}^{\phi_{\mu o}+\Delta\phi_\mu} \int_{R_{\mu o}-\Delta R_\mu}^{R_{\mu o}+\Delta R_\mu} \frac{\cos[(2\nu + 1)\phi_\mu]}{R_\mu^{2\nu}} d\phi_\mu\, dR_\mu \quad (A.10)$$

Consequently $$C_{\mu,\nu} = \frac{\cos[(2\nu + 1)\phi_{\mu o}]}{R_{\mu o}^{2\nu+1}} \cdot \frac{\sin[(2\nu + 1)\Delta\phi_\mu]}{(2\nu + 1)\Delta\phi_\mu} \{1 + \quad (A.11)$$

$$\frac{1}{3}\binom{2\nu + 1}{2}\left(\frac{\Delta R_\mu}{R_{\mu o}}\right)^2 + \frac{1}{5}\binom{2\nu + 3}{4}\left(\frac{\Delta R_\mu}{R_{\mu o}}\right)^4 + \cdots$$

$$\cdots + \frac{1}{2m + 1}\binom{2\nu + 2m - 1}{2m}\left(\frac{\Delta R_\mu}{R_{\mu o}}\right)^{2m} + \cdots \}$$

In this expression, the part dependent on $\Delta R_\mu$ is expanded into a series in powers of $\Delta R_\mu/R_{\mu o}$. The series in curly brackets has the same form for all the n winding stacks. Therefore, if all the n winding stacks have the same $\Delta\phi_\mu = \Delta\phi$ and the same ratio $\Delta R_\mu/R_{\mu o}$, the series in curly brackets in (A.11) and the expression $$\frac{\sin[(2\nu + 1)\Delta\phi]}{(2\nu + 1)\Delta\phi}$$

can be factored out of the sum over the winding stacks in accordance with equations (1) ... (n), and the coils made up of winding stacks are most homogeneous when equations (1) to (n) are satisfied for the mid-points of the winding stacks.

B. Coils bounded in the z direction

Figure 5A:
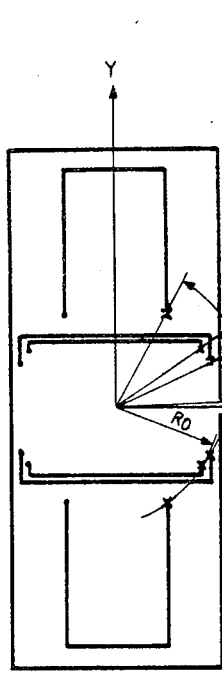
FIG. 5a is the vertical section.
Figure 5B:
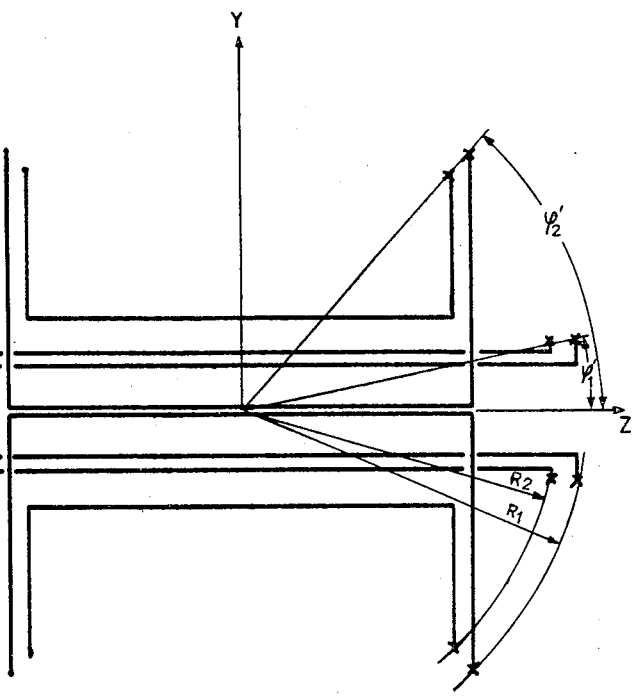
FIG. 5b the side view.
Figure 5C:
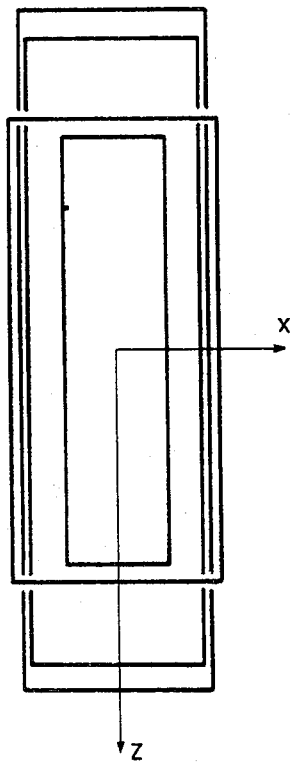
FIG. 5c the ground plan of the coil.
Figures 6A, 6B:
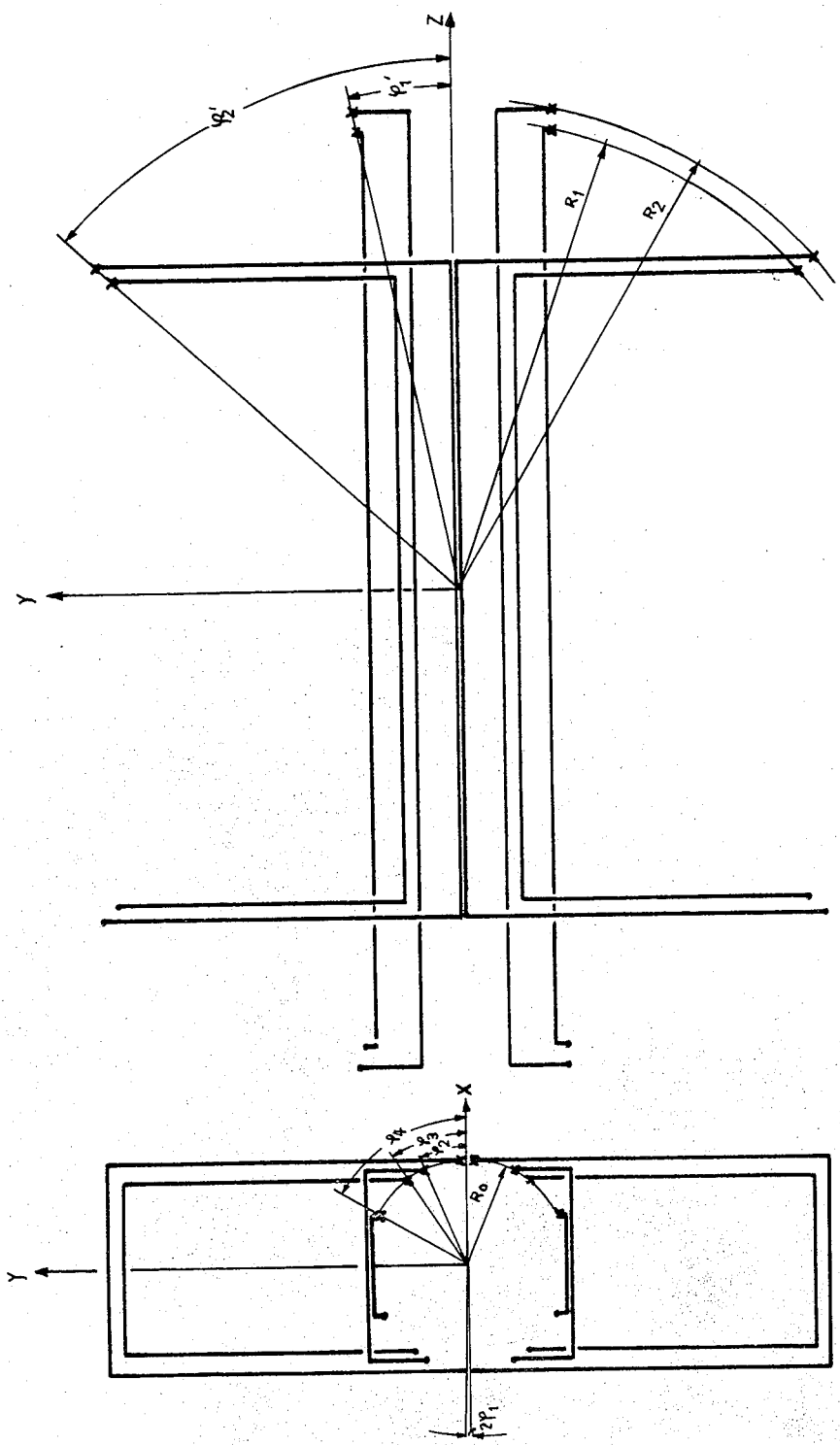
FIG. 6a is the vertical section.
FIG. 6b the side view.

Apart from coils having the same angles in the y, z plane as in the x, y plane (FIGS. 3 and 4), there is a further possibility for n=4, i.e. of using the angles for n=2 in pairs in the y, z plane. If, for example, coil 4 from Table 1 has the radius $R_o$ in the x, y plane and the radii $R_{1,2} \geq 3 R_o$ in the y, z plane, it will be very homogeneous at the center along a cylinder having the radius 0.15 $R_o$ and the length 0.3 $R_o$, provided the angles $\phi_1' = 12°$ and $\phi_2' = 48°$ are used in the z, y plane. Coils of this kind are shown in FIGS. 5–7 in which, for simplicity, the connections between turns and the leads have been omitted. In FIG. 5 the first interfering term in series (A.4b) in the x, y plane is of the order $\rho_{x,y}^{10} = 0.15^{10} \approx 5.8 \cdot 10^{-9}$, by comparison with the zero-order term (this also corresponds approximately to the maximum relative field deviation for $\rho = 0.15$). In the z, y plane, on the other hand the interfering term is of the order $\rho_{y,z}^6 = (0.15/3)^6 \approx 1.56 \cdot 10^{-8}$. These interfering terms must be weighted by the field $H_{yo}$ generated by the relevant parts of the coil at the center. Since the contribution to the field made by the wires in the z, y plane, owing to the larger radius, is smaller by a factor of 3 than the contribution made by the wires in the x, y plane, the remaining deviation is approx. $5.2 \times 10^{-9}$, so that both planes make approximately equal contributions to the inhomogeneity. FIG. 5b shows a similar coil, which is somewhat longer ($4.5 \times R_o$) and is therefore homogeneous over a somewhat longer region. Its main advantage, however, is that the internal region is fully accessible in the z direction, i.e. a relatively thick tube can be placed inside it, which is important when constructing a cryostat for a superconductive coil of this kind. The two coils have a further disadvantage in that some of the wires are parallel to the y axis (which has not been taken into consideration in the preceding calculation) and generate interfering field components in the x and z direction near the center. In the coil in FIG. 5c, this disadvantage is obviated by oblique projections at the coil ends. In this case, the field near the middle is determined only by the wires in the x and z direction, i.e. the deviation in the field of the coil is less than $10^{-8}$ over a cylinder of radius $0.15 \times R_o$ and length $0.3 \times R_o$.

However, the coil has this homogeneity only if the angle can be kept exact to within $\pm 0.001°$, which is difficult in practice. However, if a coil of this kind is used as a cryomagnet for nuclear magnetic resonance, the sample will always rotate rapidly around the z axis. Since all the interfering terms are proportional to $\cos 2\nu\theta (1 \leq \nu \leq \infty)$, they are averaged out by the rotation, since the average value of the cosine always disappears during complete periods. These coils, therefore, even if they do not reach the theoretical homogeneity, are still very suitable for generating $H_o$ fields for nuclear magnetic resonance experiments.

If the coils are used for generating less homogeneous fields over larger volumes, the coils in FIG. 7 have a field deviation of $6 \times 10^{-3}$ in the x, y plane for $\rho_{x,y} = 0.6$ and a deviation of approx. $6 \times 10^{-5}$ in the z direction for $\rho_{y,z} = 0.6/3$. In spaces as large as this, the angles are of less importance. Even if the angles deviate by $\pm 1°$ from the optimum values, the homogeneity is not appreciably worsened in this space (cylinder radius 0.6 $R_o$, length 1.2 $R_o$).

C. Coils with a clearly-marked boundary in the z direction

As shown in FIG. 6, in which the leads and the connections between turns are omitted, the above coils in the y, z plane are governed not by equations (1) to (n) but by the following equations:

$$\sum_{\mu=1}^{n} \cos(3\phi_\mu')\cos^3\phi_\mu' = 0 \quad (C.1)$$

$$\sum_{\mu=1}^{n} \cos(5\phi_\mu')\cos^5\phi_\mu' = 0 \quad (C.2)$$

Actually (C.2) cannot be made to vanish completely, e.g. for n=3, if (C.1) vanishes simultaneously. The optimum angles, shown in FIG. 6, are:

$$\phi_1' = 19,5913°, \phi_2' = 50°, \phi_3' = 53°$$

At these angles, we have:

$$\sum_{\mu=1}^{3} \cos(3\phi_\mu')\cos^3\phi_\mu' = 7 \cdot 10^{-7} \text{ and}$$

$$\sum_{\mu=1}^{3} \cos(5\phi_\mu')\cos^5\phi_\mu' = -0,1471$$

Accordingly, the field deviation in the z direction is approx. 2% for $\rho_z = 0.6$, approx. 6% for $\rho_z = 0.8$ and approx. 9% for $\rho_z = 0.9$. The coil in FIG. 6 has a maximum total field deviation of approx. 9% over a cylinder of radius 0.75 R and length 0.9 L. Coils of the kind shown in FIG. 6 therefore suitable high-frequency transmitters for mass flow measurements.

To conclude, the main advantages of the coils described hereinbefore in connection with Tables and explanations is that they are more homogeneous than the prior-art coils (i.e. cylinder coils or LR coils). They enclose the measured volume more closely than e.g. a very homogeneous Helmholtz coil, and therefore save space. More particularly, they can be constructed so that they remain relatively homogeneous even if the volume of measured sample is large (see Table 3). This applied both to single-wire coils as shown in FIGS. 1–9 and to coils comprising winding stacks as in FIG. 10.

Single-wire coils (or single turns) are easy to insulate from one another and are therefore particularly suitable as high-frequency coils transmitting high power for producing homogeneous magnetic high-frequency fields. They also differ in construction and operation from known LR coils.

If the individual turns are replaced by winding stacks having the described cross-section, the coils can be used as field coils (either superconductive or with air gaps) for generating $H_o$. In that case they are used either for producing relatively homogeneous $H_o$ fields over large volumes or for producing extremely homogeneous fields over smaller volumes. Depending on the application, the coils can be shaped so that the magnetic field at the ends of the coils has a steep gradient, i.e. has relatively sharp boundaries in space.

I claim:

1. A coil for the production of a magnetic field, the coil comprising 2 n turns, n being a positive integer greater than unity, said coil having n sets of coil sides, each set being disposed parallel to a common axis and the coils in each set being disposed symmetrically with respect to two orthogonal axes at right angles to said common axis, and wherein the distance $R_\mu$ of the coil sides to said common axis and the angle $\phi_\mu$ between an axis (x) of the two axes and a notional line joining the common axis to the coil side in the first quadrant of the coordinate system defined by said two axes are such that n equations are satisfied for equal currents through every coil side, each of said equations being of the form $$\sum_{\mu=1}^{n} \cos(2r+1)\phi_\mu/R_\mu(2r+1) = 0$$

where r is a positive integer, which for the respective n equations, has the values 1, 2, 3 ... n.

2. A coil according to claim 1, in which the coil sides consist of single wires.

3. A coil according to claim 1, in which the coil sides comprise stacks of turns in segmental form.

4. A coil according to claim 1, said coils having oblique projections at the ends thereof.

5. A coil according to claim 1, wherein the sides have a clearly defined boundary in the z direction in the y, z plane, and the following equations are satisfied:

$$\sum_{\mu=1}^{n} \cos(3\phi_\mu') \cdot \cos^3\phi_\mu' = 0$$

$$\sum_{\mu=1}^{n} \cos(5\phi_\mu') \cdot \cos^5\phi_\mu' = 0.$$

6. A coil according to claim 5, wherein $\psi_1'$ is equal substantially to 19.5913°, $\psi_2'$ is equal substantially to 50°, and $\psi_3'$ is equal substantially to 53°.

* * * * *